US006639771B2

United States Patent
Li

(10) Patent No.: US 6,639,771 B2
(45) Date of Patent: Oct. 28, 2003

(54) INTERNET ESD-SHUNT DIODE PROTECTED BY DELAYED EXTERNAL MOSFET SWITCH

(75) Inventor: Xianxin Li, Milpitas, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 393 days.

(21) Appl. No.: 09/681,269

(22) Filed: Mar. 12, 2001

(65) Prior Publication Data

US 2002/0131220 A1 Sep. 19, 2002

(51) Int. Cl.[7] ................................................. H02H 9/00
(52) U.S. Cl. ........................ 361/56; 361/18; 361/111; 395/283
(58) Field of Search ............................. 361/56, 18, 111, 361/118; 395/283

(56) References Cited

U.S. PATENT DOCUMENTS

| 5,173,755 A | 12/1992 | Co et al. .................. 257/361 |
| 5,311,391 A | 5/1994 | Dungan et al. ............... 361/56 |
| 5,498,906 A | * 3/1996 | Roane et al. ............... 257/724 |
| 5,561,577 A | 10/1996 | Motley ....................... 361/56 |
| 5,740,378 A | 4/1998 | Rehl et al. ................ 395/283 |
| 5,742,085 A | 4/1998 | Yu .............................. 257/360 |
| 5,745,323 A | 4/1998 | English et al. .............. 361/56 |
| 5,751,525 A | * 5/1998 | Olney ......................... 361/56 |
| 5,774,315 A | * 6/1998 | Mussenden ................. 361/18 |
| 5,784,242 A | 7/1998 | Watt .......................... 361/111 |
| 5,825,600 A | 10/1998 | Watt .......................... 361/56 |
| 5,881,251 A | 3/1999 | Fung et al. ................. 395/283 |
| 5,991,134 A | 11/1999 | Tan et al. .................... 361/56 |
| 6,011,420 A | 1/2000 | Watt et al. ................. 327/310 |
| 6,022,769 A | 2/2000 | Wu ............................ 438/200 |
| 6,034,854 A | 3/2000 | Suga .......................... 361/56 |
| 6,118,641 A | 9/2000 | Atkins et al. ................ 361/56 |
| 6,138,195 A | 10/2000 | Bermingham et al. ...... 710/104 |

* cited by examiner

Primary Examiner—Brian Sircus
Assistant Examiner—James A Demakis
(74) Attorney, Agent, or Firm—Stuart T. Auvinen

(57) ABSTRACT

Electro-static-discharge (ESD) protection of an integrated circuit chip is enhanced by an EOS protection circuit using external components. An external MOSFET is placed in series with the ground pin of the integrated circuit chip. The external MOSFET has a gate coupled to a power bus through a gate resistor, and is bypassed by an ESD capacitor. The external MOSFET turns on after a delay when power is applied during hot insertion. The delay is determined by a power-to-ground bypass capacitor. The time delay of the on stage of the MOSFET inhibits ground current generated by EOS voltage leaked from the power supply through parasitic resistances, capacitances, and inductances, preventing ESD-protection diodes inside the chip from burning out from this EOS pulses that occur during hot insertion. The ESD bypass capacitor shunts the initial ESD pulse to ground before the external MOSFET turns on.

19 Claims, 5 Drawing Sheets

INTERNET ESD-SHUNT DIODE PROTECTED BY DELAYED EXTERNAL MOSFET SWITCH

BACKGROUND OF THE INVENTION

This invention relates to circuits for electro-over-stress (EOS) protection, and more particularly for improving internal electro-static-discharge (ESD) protection using external components.

Significant advances in semiconductor process technology have produced extremely small transistors. These tiny transistors have thin oxide and insulating layers that can easily be damaged by relatively small currents with even a moderate driving force (voltage). Special care is required when a person handles these semiconductor devices.

Static electricity that normally builds up on a person can discharge across the input pins or a semiconductor integrated circuit (IC or chip). IC chips are routinely tested for resistance to such electro-static-discharges (ESD) using automated testers that apply a voltage across different pairs of pins of the chip. Any pair of pins may be chosen for the ESD test.

FIG. 1 shows a prior-art integrated circuit (IC) chip being tested with an ESD pulse. Chip 10 contains complementary metal-oxide-semiconductor (CMOS) transistors such as transistor 12 that is coupled between input pin A and output pin B, which are some of pins 14 of chip 10. During normal operation, a power supply voltage is applied to Vcc pin 16, and a ground supply is applied to ground pin 18.

To protect inputs from ESD pulses, protection diodes are often added to each input pin of chip 10. Protection diode 20 turns on when the input voltage is sufficiently above or below the ground voltage. Diodes can be formed using diffusion regions or well regions in the semiconductor substrate.

Diode 20 is reverse biased and off during normal operation with typical power-supply and ground voltages. However, when a positive ESD pulse is applied between pin A and ground, the voltage is larger than the reverse-bias turn-on voltage for diode 20, and diode 20 conducts current in the reverse direction. When a negative ESD pulse is applied across pins A and ground, diode 20 is forward biased and conducts a large current.

Diode 20 is designed to pass industry-standard ESD tests. These tests generate ESD pulses based on models such as the ESD machine model, which creates the ESD pulse by discharging a 200-pF capacitor that was charged to 100–400 volts, or the ESD human-body model, which creates the ESD pulse by discharging a 100-pF capacitor that was charged to 1000–4000 volts. The human-body model discharges the capacitor through a 1.5 k-ohm resistor, which limits the peak current in the pulse but extends the duration of the pulse.

Since the current of both the ESD human model and the machine model are discharged from a small 100 or 200 pF capacitor, the duration of the discharged current is very short.

When the positive ESD high voltage pulse applied to pin A, diode 20 will break over around +14.7V and current is discharged from the 100 pf or 200 pF capacitor (of the ESD human body model or machine to ground connected to pin 18. Meanwhile the voltage applied to transistor 12 connected to pin A is limited to 14.7V. Transistor 12 can tolerate α14.7V and therefore is protected.

When a negative ESD high voltage pulse is applied to pin A diode 20 is forward biased relative to ground pin 18 at −0.7V (at 10 ma) to −3.3V (at 500 ma). Diode 20 can tolerate a −500 ma forward-bias current at −3.3 volt without damage. Therefore, diode 20 is vulnerable when a positive ESD voltage pulse is applied to one of pins 14.

Diode 20 can tolerate the standard ESD human model/machine model and the short discharge current duration, at both positive and negative directions without being damaged. Diode 20 can tolerate this standard ESD voltage repeatedly and operates properly after stress.

Diode 20 can be burned out by electro-over-stress (EOS) pulses that are low voltage but higher current (100 ma above) with long duration. These kinds of pulses can be generated in real-world hot-swap interfaces for telecom and datacom applications.

FIG. 2 highlights a telecom hot-swap application that has caused ESD-diode failures. Diode 20 has been observed to have burned out in some hot-swap telecommunications applications. In the hot-swap application, chip 10 is mounted on a removable printed-circuit board (PCB) 94. When removable board 94 is plugged into backplane bus connector 90, sparks are sometimes seen, since the backplane bus board 92 remains powered up during insertion of removable board 94.

Telecom and datacom applications can use a large power-supply voltage of 48 volts in the backplane bus. DC—DC couplers 80, 81 are used on removable board 94 and on backplane board 92 to isolate the power-supply and ground voltages on different boards. There is a common ground pin 103 between the backplane ground bus and removable board 94 ground bus. However, before common ground pin 103 is connected during insertion, there is no common ground yet, and the DC voltage could be +48 to −48 volts relative to ground pin 18 of chip 10. DC coupler 80 can be a transformer that steps the 48-volt input down to a 5-volt supply to chip 10.

Various parasitic resistances, capacitances, and inductances 82 exist on removable board 94 that can couple some of the 48-volt power-supply voltage to pins of chip 10. Although the 48-volt supply is stepped down to 5 volts to power bus 42 and Vcc pin 16, some coupling of the 48-volt backplane supply can occur on ground bus 44 and through diode 20 to input pins 14 of chip 10 during insertion. For example, buffer 88 on backplane board 92 can drive +5 volts to input pin 14 during insertion of removable board 94, while ground bus 44 is below ground, due to coupling of −48 volts through capacitances, and inductances 82.

During insertion, before common ground pin 103 is connected, voltages on input pins 14 have reached 30 volts, with currents of 100 mA. However, diode 20 can burn out with only 30 mA at 14.7 volts reverse bias. Thus hot-swap insertion of telecom boards can produce a sufficiently large EOS pulse to burn out ESD protection diode 20 in chip 10. Although diode 20 passes the standard-model ESD tests, and can perform the ESD protection function fairly well without being damaged, it fails in real-world telecom applications.

During hot insertion, if the connector ground pin 103 connects to backplane bus connector 90 before the signal pin 104 connects, the EOS pulse leaked from power supply 85 through parasitic resistances, capacitances, and inductances 82 can flow through ground pin 103 before it causes damage. Otherwise if signal pin 104 is connected to connector 90 before ground pin 103, the EOS pulse may damage diode 20.

What is desired is additional protection against such EOS pulses seen in hot-swap telecom/datacom applications.

Since re-design of chip 10 is difficult, and such telecom hot-swap failures are rare, an external circuit is desired for EOS protection for such applications. An external protection circuit is desired to protect the internal ESD protection diode from failure during hot-swap board insertion.

DETAILED DESCRIPTION

The present invention relates to an improvement in EOS protection circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
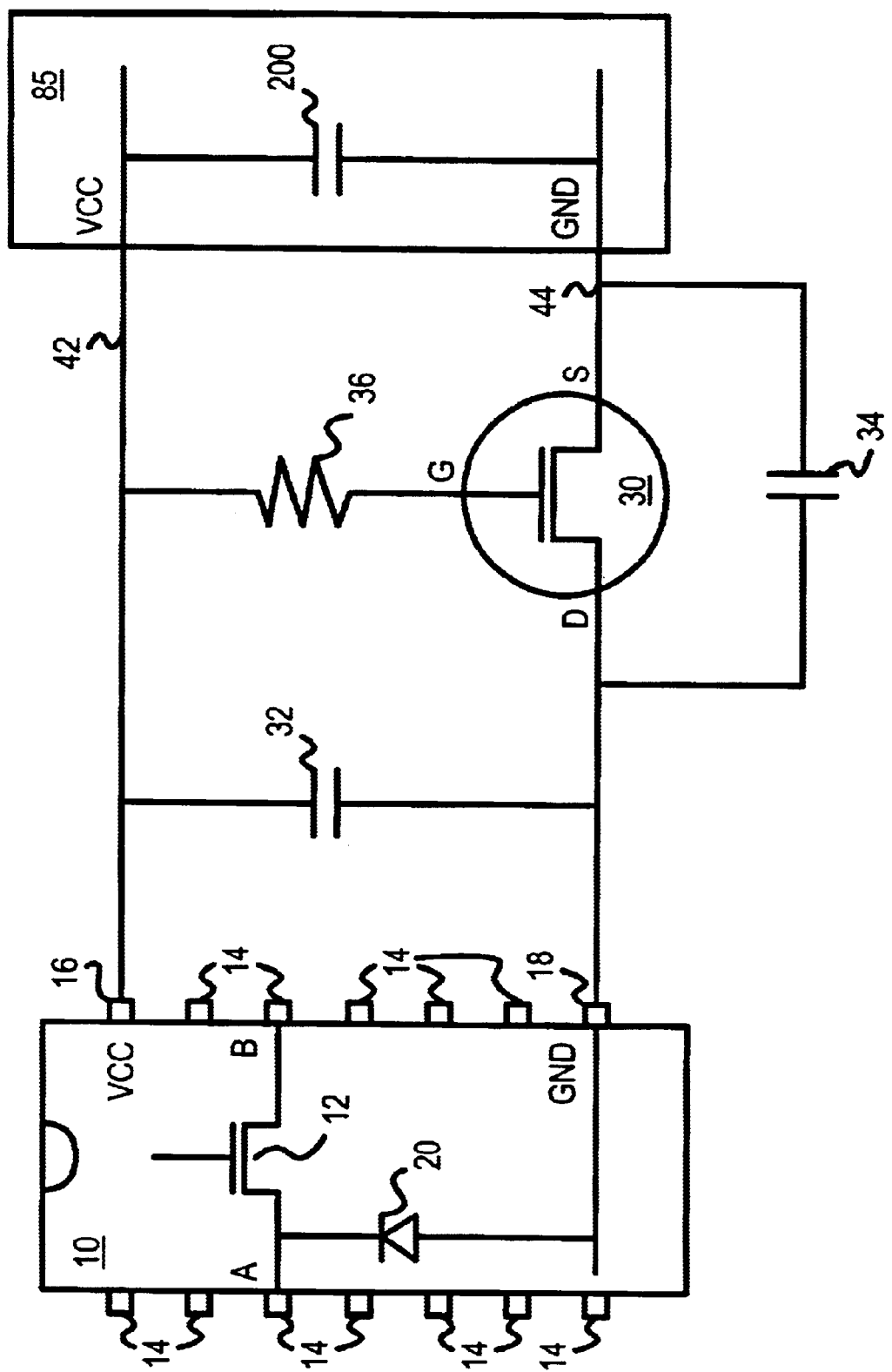
FIG. 3 is a diagram of an external EOS protection circuit for EOS immunity of a CMOS chip.

FIG. 3 is a diagram of an external EOS protection circuit for EOS immunity of a CMOS chip. CMOS integrated circuit chip 10 includes transistor 12 coupled as a switch between input and output pins 14. Other transistors (not shown) are included in chip 10 between other pairs of pins 14. Control logic in chip 10 can be included to enable and disable the gate of transistor 12. This control logic is powered by Vcc pin 16 and ground pin 18.

ESD protection diodes are integrated within chip 10 between each input and ground pin 18. ESD protection diodes can also be included for output pins. One such diode 20 is shown between pin A and ground pin 18. Diode 20 is normally reverse biased and off, but at higher reverse biases (positive voltage on pin A relative to ground) it breaks down and conducts in the reverse direction.

Diode 20 has been observed to fail under some EOS conditions. While chip 10 could be redesigned and a larger diode 20 used, another more immediate solution is to add an external EOS-protection circuit.

External metal-oxide-semiconductor field-effect transistor MOSFET 30 is a discrete transistor that is mounted on the hot-swap printed-circuit board (PCB) containing chip 10. A package with several transistors could be substituted, and such MOSFETs are commercially available at low cost. In this embodiment an n-channel MOS transistor is used, but other kinds of transistors could be substituted with appropriate modifications to the external connections.

External MOSFET 30 is connected to ground pin 18 of chip 10. It conducts the ground current from chip 10 to the board's ground bus 44. The power-supply bus 42 of the hot-swap board is connected directly to Vcc pin 16 of chip 10.

During normal operation, external MOSFET 30 is tuned on by the power-supply voltage that is applied to the gate of external MOSFET 30 through gate resistor 36. External MOSFET 30 conducts the operating Icc current of chip 10 from its drain, connected to ground pin 18, to its source, connected to ground bus 44, when its gate is at least 1 volt higher than its source. The substrate of MOSFET 30 can be internally connected to its source. Since power-supply bus 42 is normally 3 or 5 volts above ground, external MOSFET 30 is normally on.

External MOSFET 30 adds a small series resistance to the ground path from chip 10. This resistance is the on-resistance of MOSFET 30, which is typically less than 20 ohms. The voltage drop across MOSFET 30 depends on the current drawn by chip 10, and is shown later in FIG. 4 to be less than 0.03 volt when the on-stage resistance of MOSFET 30 is 6 Ohms with a 5 mA Icc power current.

Bypass capacitor 32 is mounted as close to Vcc pin 16 and ground pin 18 as possible to minimize inductive effects. Bypass capacitor 32 acts as a bypass capacitor to minimize Vcc ripple and ground bounce as the current drawn by chip 10 varies during operation. A 0.1 micro-Farad capacitor can be used.

Capacitor 200 is the output bypass capacitor of power supply 85 on hot swap board 94. It is typically 100 to 1000 micro-Farads. The circuit in FIG. 3 takes advantage of the existence of capacitor 200 for the time delay function.

Capacitor 34 is connected in parallel across the source and drain terminals of MOSFET 30. The value of capacitor 34 can be chosen based on the expected ESD pulse, and can be from 0.1 to 0.47 micro-Farad. The example here uses the value of 0.22 micro-Farad.

A 0.22 micro-Farad capacitor 34 is 2200 1100 times larger than the 100 and 200 pF capacitors in ESD models. Therefore, when the ESD pulses are apply to pins 14 while MOSFET 30 is off, capacitor 34 by-passes the ESD current discharged from the 100 200 pf capacitor to ground bus 44 with a maximum 5V voltage drop. Standard ESD current is discharged from 100 pf at 2000 volt or 200 pf at 400 volt.

Therefore the ESD voltage at pins 14 is limited to 19.5V (14.7V plus 5V-max) to the ground bus 44 at the source of MOSFET 30. The drain and source of transistor 12 in chip 10 connected to pins 14 can tolerate the 19.7V when transistor 12 is off.

Therefore capacitor 34 allows the ESD diode to retain its protection function and the ESD diode will effectively shunt a standard ESD pulse to ground when MOSFET 30 is off.

When there is a relative 30V EOS pulse leaked from power supply 85 through parasitic resistances, capacitances, and inductances 82 to ground bus 44, it appears as about +30V at the pins 14 when pins 14 are connected to the output of buffer 88 at the backplane through pins 104.

The reason that the standard ESD high voltage can not burn-out diode 20 but the +30V EOS can, is because standard ESD has a current discharged from a 100 or 200 pf capacitor. Therefore the standard ESD pulse has a very short duration. But the +30 EOS has a current higher than 100 ma with a long duration. The diode can burn-out at +14.7V at 31 ma with a pulse duration that is long enough.

When this +30V EOS pulse with high potential current and long duration is applied to pins 14 while MOSFET 30 is off, it will break down diode 20 at 14.7V and charge capacitor 34. But the 0.22 micro-Farad capacitor 34 is not big enough to provide enough charging current with enough duration to damage the diode 20. Diode 20 can resume after the 30V EOS is over. Therefore, capacitor 34 allows diode 20 to retain its ESD protection function while not causing a new problem from the EOS pulse.

The drain and source of transistor 12 in chip 10 connected to pins 14 can tolerate the 30V EOS when transistor 12 is off. Transistor 12 is off at the beginning of hot insertion. The 30V EOS voltage damages diode 20 if there is no protection transistor 30 while it can not damage transistor 12.

Figure 1:
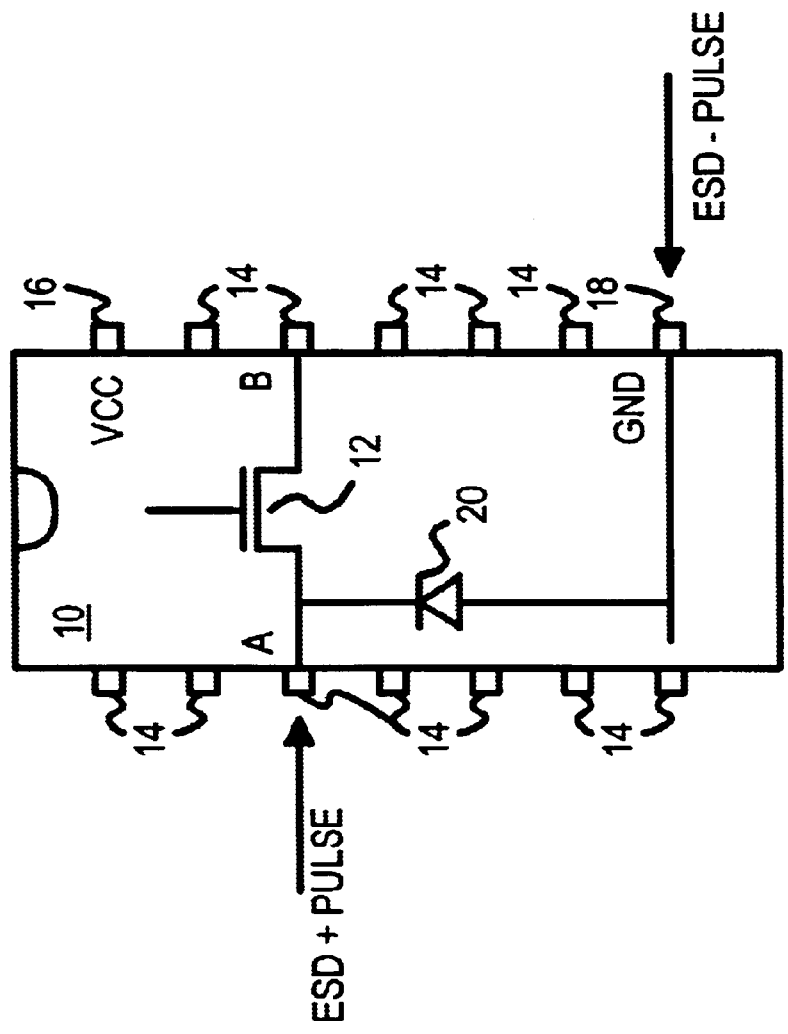
FIG. 1 shows a prior-art integrated circuit (IC) chip being tested with an ESD pulse.
Figure 2:
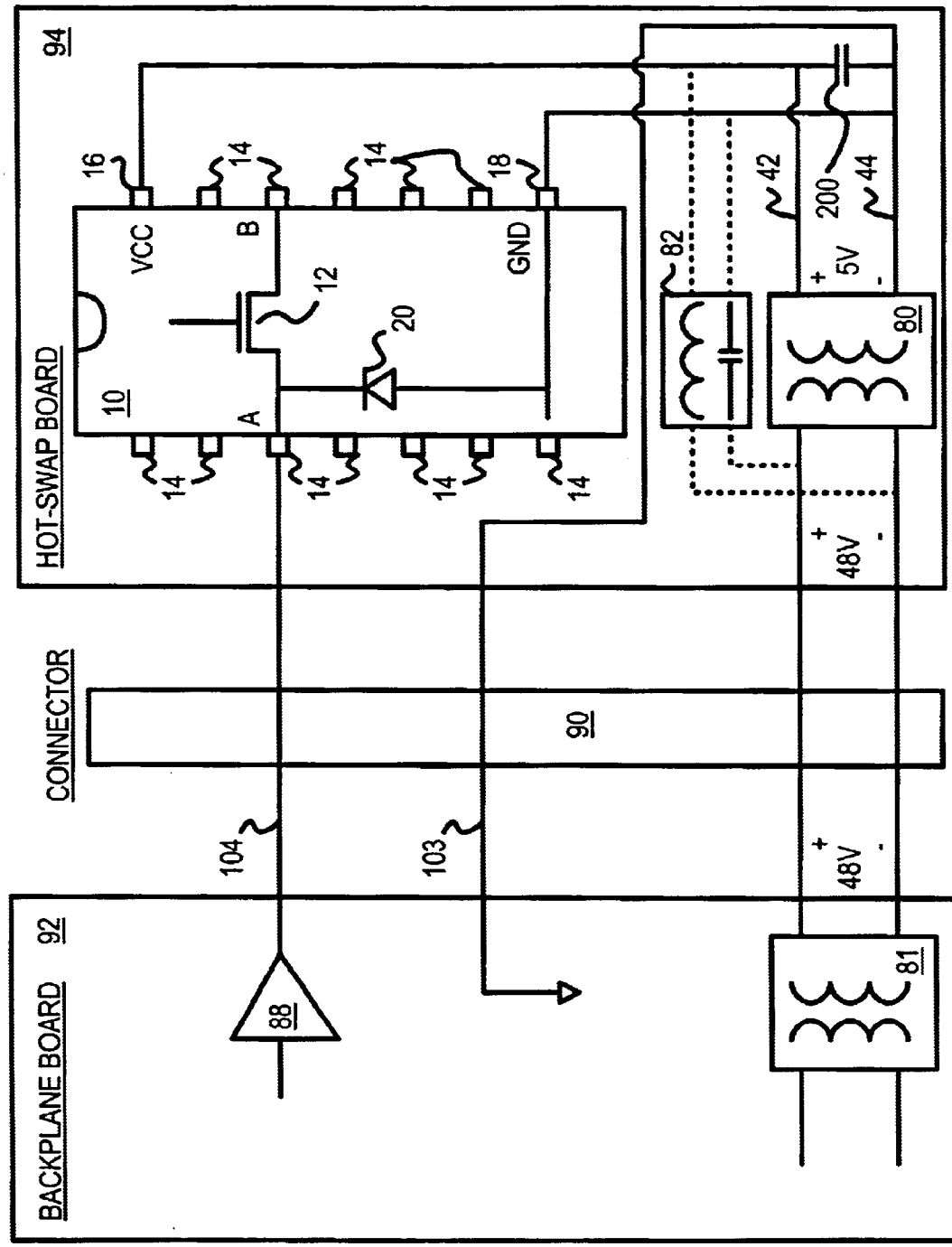
FIG. 2 highlights a telecom hot-swap application that has caused ESD-diode failures.

In FIG. 2, when the hot swap board 94 is hot inserted into connector 90, the contact sequence of ground pins 103 and signal pins 104 to connector 90 is random. Sometimes the ground pins 103 are connected first and sometimes the signal pins 104 are connected first. If ground pins 103 are connected to connector 90 before signal pins 104, then the leaked EOS voltage is conducted to the backplane through ground pins 103 without damage to diode 20. But if the signal pins 104 is connected to connector 90 before ground pins 103, the EOS voltage flows through diode 20 and can damage it.

In real hot-swap applications, the damage of diode 20 is the major failure of switch chip 10. In real applications, the only damage to the diode 20 is the positive EOS voltage applied at pins 14 to ground pin 18.

Therefore if transistor 30 is connected to ground pin 18 in series, and there is a delay time before transistor 30 is on and the delay time is long enough to insure that the EOS pulse on ground bus 44 is discharged through pins 103 to the backplane before transistor 30 is on, then transistor 30 protects diode 20 from the EOS pulse damage. Therefore when there is a ±30V EOS pulse on ground bus 44 while the transistor 30 is off, this EOS pulse does not flow through transistor 30 and cannot damage diode 20.

When the hot-swap board containing chip 10, external MOSFET 30, capacitors 200, 34, and resistor 36 is inserted into the backplane bus, a sequence of events occurs as different pins on the connector make contact. A delay occurs before external MOSFET 30 turns on. This delay is caused by bypass capacitor 200 at the output of the power supply 85. As power bus 42 powers up and rises in voltage, the large value (100 to 1000 micro-Farad) of bypass capacitor 200 must be charged up, and this introduces a delay.

As capacitor 200 is charged up, the gate of external MOSFET 30 rises in voltage until it reaches about 1.1 volt, and switch 30 is on. This time delay is longer than the time needed for ground pins 103 to contact connector 90, therefore the EOS at ground bus 44 flows through ground pins 103 to backplane before transistor 30 is on. Thus the EOS does not damage diode 20. Also, any EOS- or ESD-pulse charge stored on capacitor 34 before MOSFET 30 turned on can also be conducted away to ground bus 44.

Figure 4:
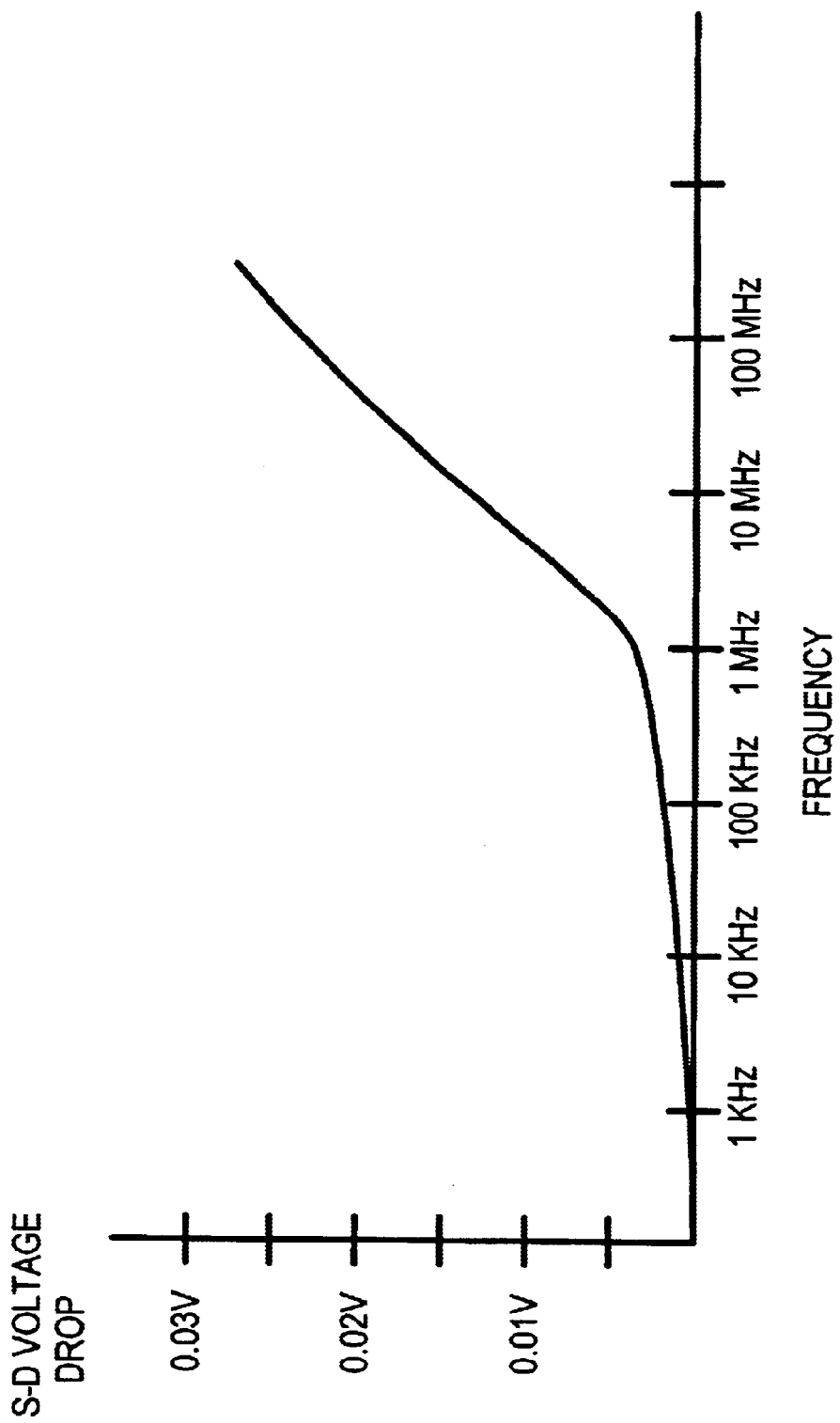
FIG. 4 is a graph of the voltage drop across the external MOSFET as a function of operating frequency.

FIG. 4 is a graph of the voltage drop across the external MOSFET as a function of operating frequency. Chip 10 draws more current at higher operating frequencies, since internal and external capacitances must be charged and discharged at a higher rate. The higher current at higher frequencies produces a greater ground current through the external MOSFET, which results in a larger drain-to-source voltage drop through external MOSFET 30.

The current remains low (under 1 mA) until about 1 MHz, when the current drawn increase more rapidly, resulting in a more rapidly increasing voltage drop. However, even at 300 MHz, the resistance of external MOSFET 30 is so small that the voltage drop is less than 0.03 volt at the on-stage resistance of MOSFET 30 is 6 Ohm with a 5 mA Icc power current. This is a sufficiently small voltage drop to not affect input thresholds. If a transistor with a smaller on-stage resistance is used, the voltage drop could be lower at higher currents.

Alternate Embodiments

Several other embodiments are contemplated by the inventors. For example, when a chip with a higher current draw is substituted, an external MOSFET with a lower on resistance can be used to compensate. Several ground pins could be used on the chip and connected together externally. DC couplers can be made from mutual-inductance devices such as transformers. The external MOSFET can provide protection for other internal ESD structures besides diodes, such as thin or thick oxide transistors. A combination of internal ESD structures can also be used, and the diode can be a part of a larger structures such as a transistor diffusion region.

Figure 5:
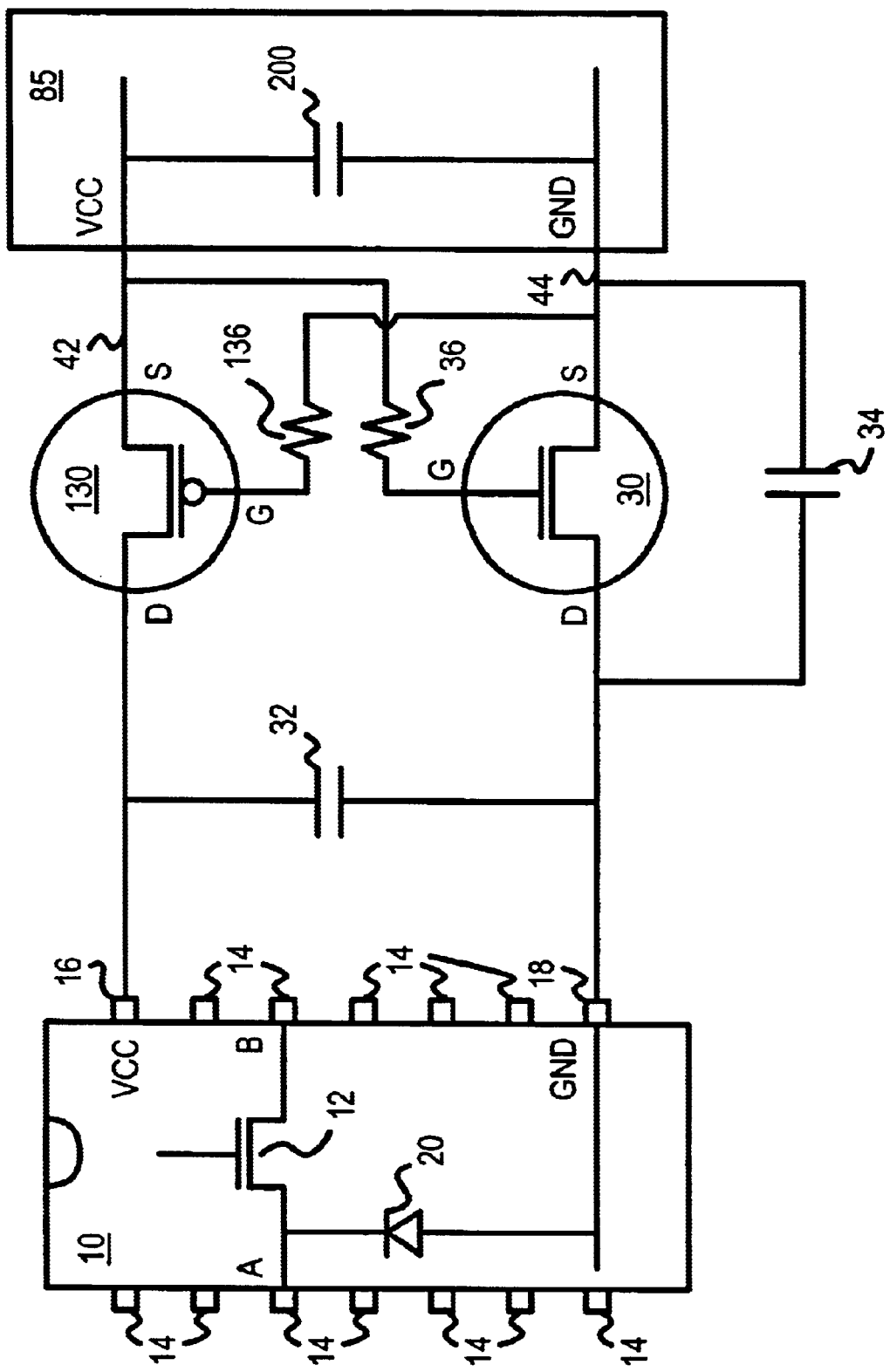
FIG. 5 is an alternate embodiment.

FIG. 5 is an alternate embodiment. P-channel MOSFET transistor 130 is added onto Vcc pin 16 in series with resistor 136 connected between the gate and ground bus 44. Transistor 130 is used to protect chip 10 from the EOS voltage leaked from parasitic resistances, capacitances, and inductances 82 to Vcc bus 42. Some applications may be able to generate such a leakage. Since capacitor 34 is in the ESD path, there is no need to add a capacitor across the drain and source of transistor 130. The working principles of transistor 130 and resistor 136 in FIG. 5 is similar to that described earlier for the circuit of FIG. 3. The external circuits in FIGS. 3 and 5 can be integrated onto a single IC chip.

Other process and transistor technologies may be substituted. Additional filtering components or more complex filters may be used. Power supplies of 2.5, 3.0, 3.3, 5.0 and other voltages are contemplated and may be freely used with the invention.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An electro-over-stress (EOS) protection circuit comprising:

a semiconductor chip having a power pin and a ground pin and input pins;

ESD protection structures in the semiconductor chip, each input pin having an ESD protection structure with a terminal connected to the ground pin and another terminal electrically connected to the power pin;

an external power bus coupled to the power pin;

an external ground bus that is not directly coupled to the ground pin and the external ground bus, the conduction path being enabled to conduct a ground current by a control gate with a time delay; and a transistor-bypass capacitor, having a terminal coupled to the ground pin and a terminal coupled to the external ground bus, whereby the external transistor inhibits the ground current through an internal protection diode during an electro-over-stress (EOS) pulse and prevents burnout of the ESD protection structures.

2. The EOS protection circuit of claim 1 wherein the external transistor is a metal-oxide-semiconductor field-effect transistor (MOSFET).

3. The EOS protection circuit of claim 1 further comprising:
a power bypass capacitor, having a terminal coupled to the power pin and a terminal coupled to the ground pin.

4. The EQS protection circuit of claim 3 further comprising:
a gate resistor, having a terminal coupled to the external power bus and a terminal coupled to the control gate of the external transistor; and
a second external transistor having a conduction path between a power pin and the external power bus, the conduction path being enabled to conduct a current by a control gate.

5. The EOS protection circuit of claim 4 wherein the ESD protection structures are protection diodes, each protection diode has a positive terminal connected to the ground pin and a negative terminal connected to the input pin,
whereby the protection diode is reverse biased by a positive pulse applied between an input and the ground pin.

6. A hot insertion board comprising:
a power bus;
a ground bus;
an integrated circuit chip, coupled to the power bus, with an input having an internal protection diode to a ground pin of the integrated circuit chip;
an external transistor, coupled between the ground pin of the integrated circuit chip and the ground bus, the external transistor conducting a ground current from the integrated circuit chip to the ground bus in response to a control gate;
a bypass capacitor, coupled between the power bus and the ground pin of the integrated circuit chip; and
a gate resistor, coupled between the power bus and the control gate of the external transistor,
whereby the external transistor inhibits the ground current through the internal protection diode during an electro-over-stress (EOS) pulse.

7. The hot insertion board of claim 6 further comprising:
a transistor-bypass capacitor, coupled in parallel with the external transistor between the ground pin of the integrated circuit chip and the ground bus.

8. The hot insertion board of claim 7 therein the power bus is directly coupled to a power pin of the integrated circuit chip, but the ground bus is connected to the ground pin through the external transistor.

9. The hot insertion board of claim/further comprising:
a DC coupler, having a pair of external terminals coupled to power-supply terminals of a hot-insertion bus, and having a pair of internal terminals that connect to the power bus and to the ground bus,
whereby the ground bus is isolated from a ground of the hot-insertion bus.

10. The hot insertion board of claim 7 wherein the internal protection diode is reverse biased when the input has a higher voltage than the ground pin.

11. The hot insertion board of claim 7 wherein the integrated circuit chip is a bus-switch chip having transistors each with a drain coupled to an input pin and a source coupled to an output pin of the integrated circuit chip.

12. The hot insertion board of claim 7 wherein during an EOS pulse that occurs during hot insertion, the transistor-bypass capacitor is charged by the EOS pulse at a current with a short duration that is not sufficient to damage the internal protection diode while the external transistor is off, until the transistor-bypass capacitor at the output of the power supply is charged, the transistor-bypass capacitor initially accepts ground current from the ESD pulse and the external transistor is off, until the bypass capacitor charges sufficiently to raise a voltage of the control gate to enable the external transistor to conduct the ground current to the ground bus,
whereby the EQS pulse is conducted to the ground bus before the external transistor turns on, without damaging the internal protection diode.

13. The hot insertion board of claim 7 wherein the external transistor is a discrete transistor in a separate package from the integrated circuit chip, the bypass capacitor, and the transistor-bypass capacitor.

14. The hot insertion board of claim 13 wherein the external transistor is a metal-oxide-semiconductor field-effect transistor (MOSFET).

15. The hot insertion board of claim 14 wherein the external transistor is an n-channel MOSFET.

16. The hot insertion board of claim 15 wherein a drain of the external transistor is coupled to the ground pin, and a source of the external transistor is coupled to the ground bus.

17. An insertable board with internal and external protection circuits comprising:
a power bus for supplying a power-supply voltage during normal operation; a ground bus;
chip means, coupled to the power bus and having a ground terminal, for connecting inputs to outputs;
ESD protection means, in the chip means, for shunting current from an electro-static-discharge (ESD) pulse applied to an input of the chip means to the ground terminal;
external transistor means, coupled to conduct current from the ground terminal of the chip means to the ground bus in response to a control gate;
bypass capacitor means, coupled between the power bus and the ground terminal, for reducing power ripple and ground bounce on the chip means as current varies;
gate resistor means, coupled between the power bus and the control gate of the external transistor mews, for charging the control gate when the power bus is activated,
whereby the ESD protection means is protected from early failure by the external transistor means.

18. The insertable board with internal and external protection circuits of claim 17 further comprising:
transistor-bypass capacitor means, coupled between the ground terminal and the ground bus, for absorbing charge from the ESD pulse before the external transistor means conducts current.

19. The insertable board with internal and external protection circuits of claim 18 wherein the external transistor means is an n-channel metal-oxide-semiconductor field-effect transistor (MOSFET).

* * * * *